(12) United States Patent
Cheng (10) Patent No.: US 6,249,342 B1
(45) Date of Patent: Jun. 19, 2001

(54) METHOD AND APPARATUS FOR HANDLING AND TESTING WAFERS

(76) Inventor: David Cheng, 711 Hibernia Ct., Sunnyvale, CA (US) 94087

( * ) Notice: Subject to any disclaimer, the term of this patent is extended or adjusted under 35 U.S.C. 154(b) by 0 days.

(21) Appl. No.: 09/347,956

(22) Filed: Jul. 6, 1999

(51) Int. Cl.⁷ .................................................. G01N 21/00
(52) U.S. Cl. ...................... 356/237.2; 414/225; 414/416
(58) Field of Search ............................. 356/237.1, 237.2, 356/237.4, 237.5; 250/442.1; 414/225, 416, 752, 753, 331; 324/765, 757; 451/43

(56) References Cited

U.S. PATENT DOCUMENTS

| | | | |
|---|---|---|---|
| 4,775,281 | * 10/1988 | Prentakis | 414/416 |
| 4,818,169 | * 4/1989 | Schram et al. | 414/255 |
| 4,907,931 | * 3/1990 | Mallory et al. | 414/225 |
| 5,479,108 | * 12/1995 | Cheng | 324/765 |
| 5,546,179 | * 8/1996 | Cheng | 356/371 |
| 5,679,060 | * 10/1997 | Leonard et al. | 415/43 |
| 6,053,688 | * 4/2000 | Cheng | 414/416 |

* cited by examiner

Primary Examiner—Frank G. Font
Assistant Examiner—Sang H. Nguyen
(74) Attorney, Agent, or Firm—Oppenheimer Wolff & Donnelly LLP (57) ABSTRACT

Disclosed is a wafer handling and testing apparatus. The wafer handling and testing apparatus includes a support assembly, a wafer handling assembly, and a probe assembly. The support assembly is capable of supporting a wafer to be tested and is also capable of rotating the wafer for testing. The wafer handling assembly is arranged to move the wafer to and from the support assembly. The wafer handling assembly is capable of moving the along a first axis and a second axis. The first axis is preferably orthogonal to the second axis. The wafer probe is arranged to test the wafer when the wafer is placed on the support assembly.

45 Claims, 8 Drawing Sheets

METHOD AND APPARATUS FOR
HANDLING AND TESTING WAFERS

CROSS REFERENCE TO RELATED APPLICATIONS

This application is related to U.S. Pat. No. 5,452,078, filed on Jun. 17, 1993, U.S. Pat. No. 5,546,179, filed on Oct. 7, 1994, and U.S. Pat. application Ser. No. 08/920,210, filed on Aug. 25, 1997, now U.S. Pat. No. 6,053,688 issued Apr. 25, 2000 all of which are incorporated by reference.

BACKGROUND OF THE INVENTION

The present invention relates to the handling of wafers, and more particularly to handling and testing semiconductor wafers in a wafer testing apparatus.

The manufacture of integrated circuit (IC) chips begins with blank, unpatternd semiconductor wafers. These wafers undergo a number of sometimes critical process steps before being formed into the final IC chip form. A substandard wafer can affect the yield (i.e., number) of usable IC chips on a wafer. It is therefore desirable to have a machine for testing wafers to ensure that the wafers meet a desired standard to maximize wafer yield.

Testing of the wafers typically involves an automated process utilizing automated wafer handling machines. In this process, the automated wafer handling machines continuously handle and test the wafers. The automated process tends to be more efficient than manual testing and handling of wafers since an automated process is typically faster, more precise, and less prone to contamination than a manual process.

One of the major uses of the automated wafer handling machines is for testing or processing the wafers to determine or change certain wafer characteristics (such as by depositing a film or removing a wafer layer). For example, automated wafer handling machines are often used to determine the orientation of a wafer, which provides a standard reference against which the location and characteristics of test points on the wafer may be measured.

A conventional art wafer handling machine has a four degree of freedom. In this machine, the wafer cassette moves up and down, the chuck rotates, the arm moves from left to right. However, one of the drawbacks of the conventional wafer handling machines is movement of the wafers within the wafer cassette. For example, when the wafer cassette moves up and down to allow a robot arm to remove a wafer from the cassette or place a wafer into the cassette, the wafers within the cassette may be subject to unwanted jarring. The vibrations caused by the jarring are potentially harmful due to the creation of particle contaminants.

In addition, the conventional wafer handling machines typically include a motor for each degree of freedom for a total of four motors. Generally, moving parts in a machine or apparatus such as motors are more prone to failure and require more maintenance than non-moving parts. Further the use of such number of motors typically require complex and costly mechanisms that require more maintenance, which is undesirable in production environments.

Thus, what is needed is an apparatus and method that can efficiently move and test wafers without moving the wafer carrier or cassette. In addition, what is needed is an apparatus and method that can move and test wafers using less number of motors so as to reduce the cost and maintenance involved with the motors.

SUMMARY OF THE INVENTION

The present invention fills these needs by providing an apparatus and a method for handling and testing wafers in an integrated system. It should be appreciated that the present invention can be implemented in numerous ways, including as a process, an apparatus, a system, a device, or a method. Several inventive embodiments of the present invention are described below.

In one embodiment, the present invention provides a wafer handling and testing apparatus. The wafer handling and testing apparatus includes a support assembly, a wafer handling assembly, and a probe assembly. The support assembly is capable of supporting a wafer to be tested and is also capable of rotating the wafer for testing. The wafer handling assembly is arranged to move the wafer to and from the support assembly. The wafer handling assembly is capable of moving the along a first axis and a second axis. The first axis is preferably orthogonal to the second axis. The probe assembly is arranged to test the wafer when the wafer is placed on the support assembly.

In another embodiment, an integrated wafer handling and testing apparatus includes supporting means, handling means, and testing means. The supporting means supports a wafer to be tested and is capable of rotating the wafer in an x-y plane. The handling means moves the wafer to and from the wafer support assembly and is capable of moving the wafer along a first axis and a second axis, which are orthogonal to each other. The testing means tests the wafer when the wafer is placed on the support means.

In yet another embodiment, the present invention provides a method for handling a wafer from a stationary wafer carrier for testing. The stationary wafer includes a plurality of wafers to be tested. The method includes (a) selecting a wafer to be tested; (b) picking up the wafer; (c) moving the wafer along an x-axis and a z-axis to a support assembly for testing; (d) placing the wafer on the support assembly; (e) rotating the supporting assembly to place the wafer at a desired test position; and (f) testing the wafer at the desired test position to determine a wafer characteristic.

Advantageously, the present invention efficiently moves and tests wafers without moving the wafer carrier or cassette by providing a wafer handling assembly that has two degrees of freedom along the first axis and the second axis. In addition, by enabling the wafer handling assembly to move along the second axis, a support assembly need not move along the second axis, thereby eliminating the need for a motor in some embodiments of the present invention.

These and other advantages of the present invention will become apparent to those skilled in the art upon reading the following detailed description of the invention and studying the accompanying drawings.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention for a method and apparatus of efficiently changing probe test heads that contact a substrate is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
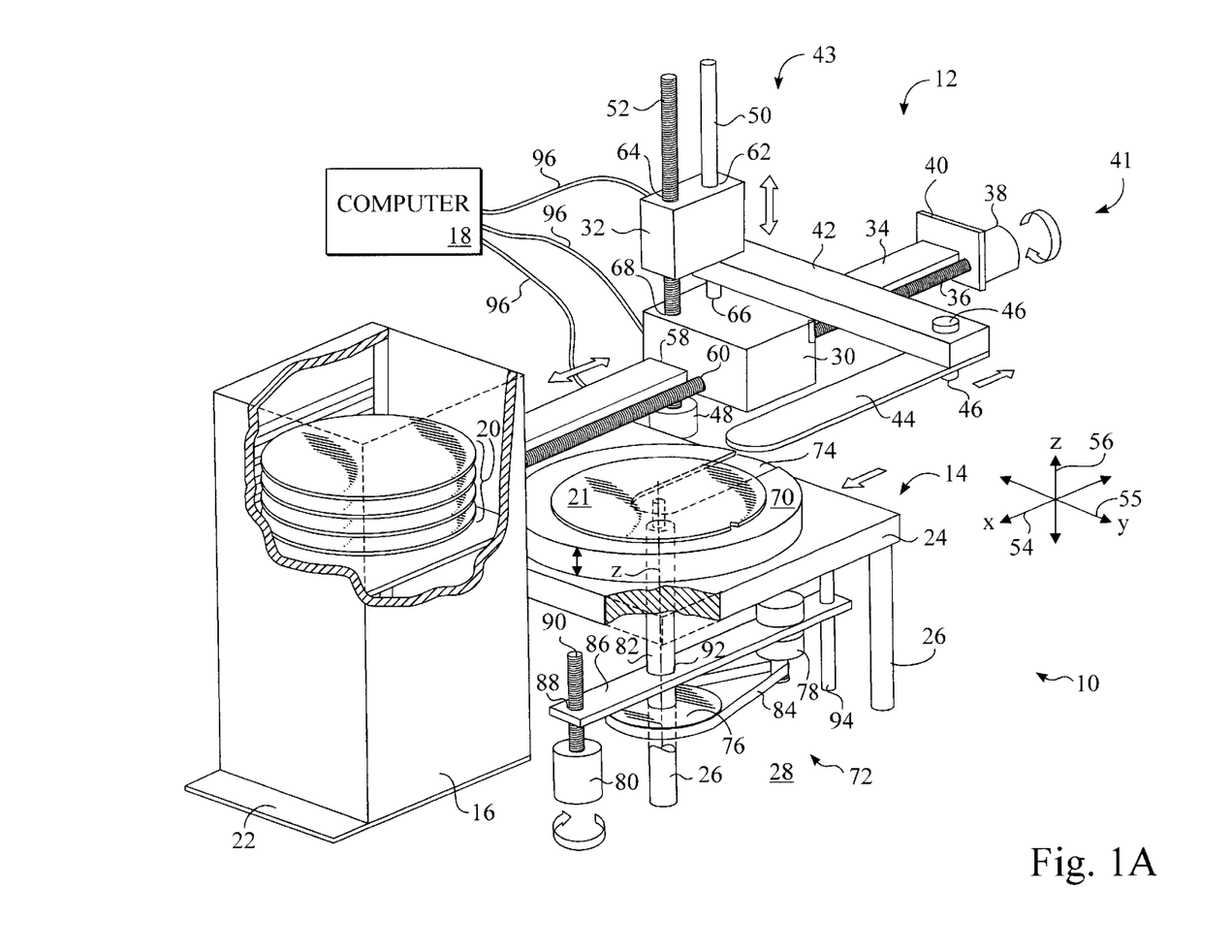
FIG. 1A illustrates an elevational view of an integrated wafer handling and testing apparatus in accordance with one embodiment of the present invention.

FIG. 1A illustrates an elevational view of an integrated wafer handling and testing apparatus 10 in accordance with one embodiment of the present invention. The wafer handling and testing apparatus 10 is configured to move individual wafers from storage to a test position, upon which the individual wafer may be tested for a variety of characteristics before being moved back to storage. The wafer handling and testing apparatus 10 includes a wafer handling assembly 12, a wafer support assembly 14, a wafer carrier 16, and a computer 18.

The wafer carrier 16 contains a number of wafers 20 to be tested and provides access to the wafer handling assembly 12 for testing the wafers 20. The wafer carrier 16 may be a wafer cassette, which holds a number of wafers in slots in an open, unsealed container. For example, the wafer cassette can be positioned so that its opening faces the wafer support assembly 14 and wafer handling assembly 12.

In the alternative, the wafer carrier 16 may be a wafer pod, which is an enclosed and sealed container that prevents contaminants from reaching the held wafers. For example, the wafer pod can be implemented as a Front Opening Unified Pod (FOUP), which is an industry standard wafer pod that includes a door designed to be opened from the front of the carrier rather than the bottom of the carrier (such as in a SMIF Pod). It should be appreciated that the present invention may utilize wafers of any suitable size for testing including, for example, wafers with diameters of all sizes up to 300 nm.

Supporting the wafer carrier 16 in the wafer handling and testing apparatus is a base plate 22 disposed on a reference surface 28. The wafer carrier 16 may be attached to the base plate 22, however it is preferred if the wafer carrier 16 is removably disposed on the base plate 22. In this manner, other the wafer carrier 16 may be removed from the base plate 22 so that other wafer carriers may also be mounted on the base plate 22 to test another set of wafers. Alternatively, the wafer carrier 16 can be removed from the base plate 22, unloaded and loaded with new wafers, and repositioned on the base plate 22.

When the wafer carrier 16 is implemented as a sealed wafer pod, the wafer carrier 16 may be provided on one side of an interface panel which seals a clean environment required for the testing processing of wafers. That is, the base plate 22 for supporting the wafer carrier 16 is located on the exterior of the environment in which processing and testing of wafers is to be accomplished.

The wafer support assembly 14 includes a base platform 24 having a plurality of legs 26, which are disposed on the reference surface 28. The reference surface 28 may be a ground surface or a structural base that provides support to the wafer handling and testing apparatus 10. In one embodiment, both the base plate 22 and the legs 26 of the base platform 24 are securely disposed on the reference surface 28. Preferably, the wafer carrier 16 and the base plate 22 is arranged such that the wafers 20 within the wafer carrier 16 are disposed above the level of the base platform 24 to facilitate access to all the wafers 20.

The wafer support assembly 14 further includes a testing chuck 70 supported by the base platform 24 and a drive mechanism 72, located under the testing chuck 70. The testing chuck 70 can be a disc-shaped, wafer-shaped, or any other shape suitable for supporting a selected wafer 21 for testing. In accordance with one embodiment of the present invention, the chuck 70 is rotatable about a central z-axis and may be moved upwardly or downwardly parallel to a z-axis 56. The chuck 70 also includes a blade insert 74, which assists the wafer handling assembly in moving the selected wafer 21.

The drive mechanism 72 is operative to rotate the chuck 70 about the central z-axis. The drive assembly 72 comprises a pulley 76, and a number of motors 78 and 80. The pulley 76 is connected to the chuck 70 by a shaft 82 that extends through the base platform 24 through suitable bearings (not shown). The pulley 76 is connected to the motor 78 by a drive belt 84. The motor 78 rotates the pulley 76 and thereby rotates the shaft 82 and the chuck 70. The motor 78 is connected to a support 86 of the motor 80.

One end of the support 86 is provided with a threaded nut 88, which engages a lead screw 90 coupled to rotate in response to the motor 80. The threaded nut 88 may be an anti-backlash nut or a ball screw nut. The support 86 is connected to the shaft 82 by a bearing 92. The far end of the support 86 is secured to the motor 78 by a rigid coupling and secured to the guide shaft 94 by a sliding connection. The motor 80 is positioned on the reference surface 28.

When the motor 80 rotates, the support 86 moves parallel to the z-axis 56 and carries the shaft 82, the pulley 76, the motor 78, and the chuck 70 in the same direction. The bearing 92 of the support 86 allows the shaft 82 to rotate freely while still being securely held by the support 86. It should be appreciated that other mechanisms may also be used to implement the movement parallel to the z-axis 56 such as a linear actuator. In addition, gears may impart rotational motion to the chuck 70.

Alternatively, the testing chuck 70 can be moved parallel to x-axis 54 or y-axis 55. This movement can be implemented for example, by positioning parallel tracks on the sides of the base platform 24 and moving the support assembly 14 along the tracks using wheels or gears. The motors 78 and 80 are preferably stepper motors or position servo motors controlled by the computer 18 through a bus 96. The computer 18 is configured to precisely rotate the motors 78 and 80 in either direction, thus allowing the chuck 70 to rotate and move along the z-axis in precisely-defined motions.

The wafer handling assembly 12 includes a first carriage assembly 41, which is arranged to move along the x-axis 54 in a x-y plane. The first carriage assembly 41 includes a carriage 30, a guide shaft 34, a lead screw 36, a motor 38, and a plate 40. The guide shaft 34 is coupled to the plate 40 and extends through a bore 58 in the carriage 30 to allow the carriage 30 to slide along the guide shaft 34. The lead screw 36 is coupled to the motor 38 through the plate 40 and extends through a threaded bore 60 in the carriage 30. In this configuration, when the lead screw 36 is rotated, the carriage 30 moves along the x-axis 54 along the length of the guide shaft 34 and the lead screw 36.

The motor 38 is preferably a stepper motor or position servo motor and is coupled via a bus 96 to the computer 18. The computer 18 controls the motor 38 precisely to position the carriage 30 along the x-axis 54. Other mechanisms may be used to move the wafer handling assembly 12 parallel to the x-axis. For example, the carriage 30 can be driven along the guide shaft 34 and the lead screw 36 by motor gears.

The wafer handling assembly 12 also includes a second carriage assembly 43, which is movably mounted on the carriage 30 of the first carriage assembly 41 to allow translation along the x-axis 54. The second carriage assembly 43 is arranged to move along a z-axis 56 in a x-z plane and includes a carriage 32, a guide shaft 50, a lead screw 52, and a motor 48. The guide shaft 50 guides the carriage 32 along the z-axis. The guide shaft 50 and the lead screw 52 are oriented parallel to the z-axis 56, which is perpendicular to the x-axis. Preferably, the z-axis is a vertical axis.

The guide shaft 50 extends through a bore 62 in the carriage 32 in the second carriage assembly and through a bore 66 in the carriage 30 of the first carriage assembly 41. Similarly, the lead screw 52 extends through a threaded bore 64 in the second carriage assembly and through a threaded bore 68 in the carriage 30 of the first carriage assembly. The motor 48 is coupled to rotate the lead screw 52. In this configuration, when the lead screw 52 is rotated, the carriage 32 moves along the z-axis 56 along the length of the shaft 50 and the lead screw 52.

The motor 48 is preferably a stepper motor or position servo motor and is coupled to the computer 18 through the bus 96. The computer 18 controls the motor 48 to precisely position the carriage 32 in the z-axis 56. Other mechanisms may be used to move the carriage 32 parallel to the z-axis. For example, the carriage 32 can be driven along the guide shaft 50 and the lead screw 52 by motor gears, a hydraulic or pulley system, a slide or rail mechanism, or other system providing such translation.

The wafer handling assembly 12 further includes a support arm 42 that is coupled to and moves in unison with the carriage 32. A wafer blade 44 and a probe assembly 46 are coupled to the support arm 42. The support arm 42, the wafer blade 44, and the probe assembly 46 may be moved along the z-axis 56 by the second carriage assembly 43 when carriage 32 is moved along the guide shaft 50. Similarly, the support arm 24, the wafer blade 44, and the probe assembly 46 may be moved along the x-axis 54 by the first carriage assembly 41 when carriage 30 is moved along the guide shaft 34. Therefore, the wafer blade 44 and the probe assembly 46 have two degrees of freedom attained when the motors 38 and 48 drive the carriages 30 and 32 along the x-axis 54 and the z-axis 56.

The wafer blade 44 may be implemented in a variety of ways including a vacuum pick, a spatula, or an end effector. An end effector is a flat, spatula-like implement used to support a wafer from underneath the wafer and move the wafer to a desired location. In some embodiments, the wafer blade 44 may include apertures that are coupled to a vacuum pump to cause a suction force that securely holds a wafer to the wafer blade 44.

The probe assembly 46 is configured to test a wafer to determine its characteristics. In one embodiment of the present invention, the probe assembly 46 is coupled to the support arm 42 and extends out from the bottom surface of the support arm 42. In other embodiments, the probe 46 can be coupled to other areas of the support arm 42, the wafer blade 44, or the carriages 30 and 32. For example, the probe assembly 46 can be positioned on a separate support arm mounted on the carriage 30.

The probe assembly 46 includes a test head on the bottom portion of the probe assembly 46. The test head preferably contacts a wafer to make test measurements. In other embodiments, the test head does not contact the wafer, but is positioned to a desired distance above the wafer to perform tests, for example, using electromagnetic beams to determine wafer characteristics as is well known to those skilled in the art. The test head includes individual probe leads, which are designed to take test measurements on the wafer surface.

In a preferred embodiment, the test head includes a four-point probe apparatus that includes four metal, spring-loaded probes that engage the surface of a wafer. A current is usually induced in the outer probes of the four probes, and a voltage is measured across the inner probes. Such a probe is designed to measure wafer resistivity and film thickness. In other embodiments, other types of test probes can be provided to test various characteristics of wafers.

The wafer handling assembly 12 may also include an edge mapping sensor for sensing the edge of the selected wafer 21 when the support assembly 14 and the support arm 42 are positioned appropriately. Such sensor is amply described in U.S. Pat. No. 5,546,179, which is incorporated by reference. Edge mapping techniques are well known in the art and are described, for example, in U.S. Pat. No. 5,452,078, which is also incorporated by reference herein.

The wafer handling and testing apparatus 10 is thus configured to in accordance with one embodiment of the present invention as described above. In accordance with one embodiment of the present invention, the carriage assemblies 41 and 43 move wafer blade 44 into the wafer carrier 16 under one of the wafers 20. The wafer blade 44 is then moved along the z-axis 56 in an upward fashion to lift the selected wafer 21 out of the wafer carrier 16. The selected wafer 21 is then moved in the two degrees of freedom described above by the carriage assemblies 41 and 43 towards the wafer support assembly 14. The selected wafer 21 is brought to rest upon the testing chuck 70 (as shown) by sliding the wafer blade 44 into the blade insert 74. The wafer blade 44 may then move away from the testing chuck 70 without disturbing the selected wafer 21.

It is the same manner that the movement of the carriages 30 and 32 allows the probe assembly 46 to move in either or both the x-axis 54 and the z-axis 46. After the selected wafer 21 is placed upon the testing chuck 70, the carriage assemblies 41 and 43 are used to move the probe assembly 46 into contact with the selected wafer 21. The testing chuck 70 may be rotated as described above to aid the positioning of the probe assembly 46 to a specific location on the selected wafer 21. The probe assembly 46 then measures the characteristics of the selected wafer 21 as described above, and transmits the test results to the computer 18 through the bus 96.

After testing the selected wafer 21, the wafer blade 44 may pick up the selected wafer 21 using the blade insert 74 to obtain a position beneath the selected wafer 21. The wafer blade 44 then places the wafer back into the wafer carrier 16, preferably into its original wafer slot. The wafer blade 44 may then be moved to align another wafer 20 for removal and testing. In one embodiment of the present invention, the motors 38 and 48 operate may operate simultaneously to move the wafer blade 44 and the probe assembly 46 in the x and z-axes 54 and 56 at the same time. In another embodiment, the motors 38 and 48 operate only one at a time so that the wafer blade 44 and the probe assembly 46 move only along the x-axis 54 or the z-axis 56 at a time.

The computer 18 controls the movement of the components of the wafer handling and testing apparatus 10 as explained above. The computer 18 can be any suitable controller device, such as an IBM-compatible personal computer based on a Pentium class or other microprocessor, a Macintosh computer, a workstation, or other computing device. A preferred embodiment of the present invention integrates the handling, mapping, and testing functions of the wafer handling and testing apparatus 10 at a single workstation. Thus, the wafer blade 44 is able to pick up and transport the selected wafer 21 to the platform and the probe assembly 46 is able to test the wafer on the platform.

Figure 1B:
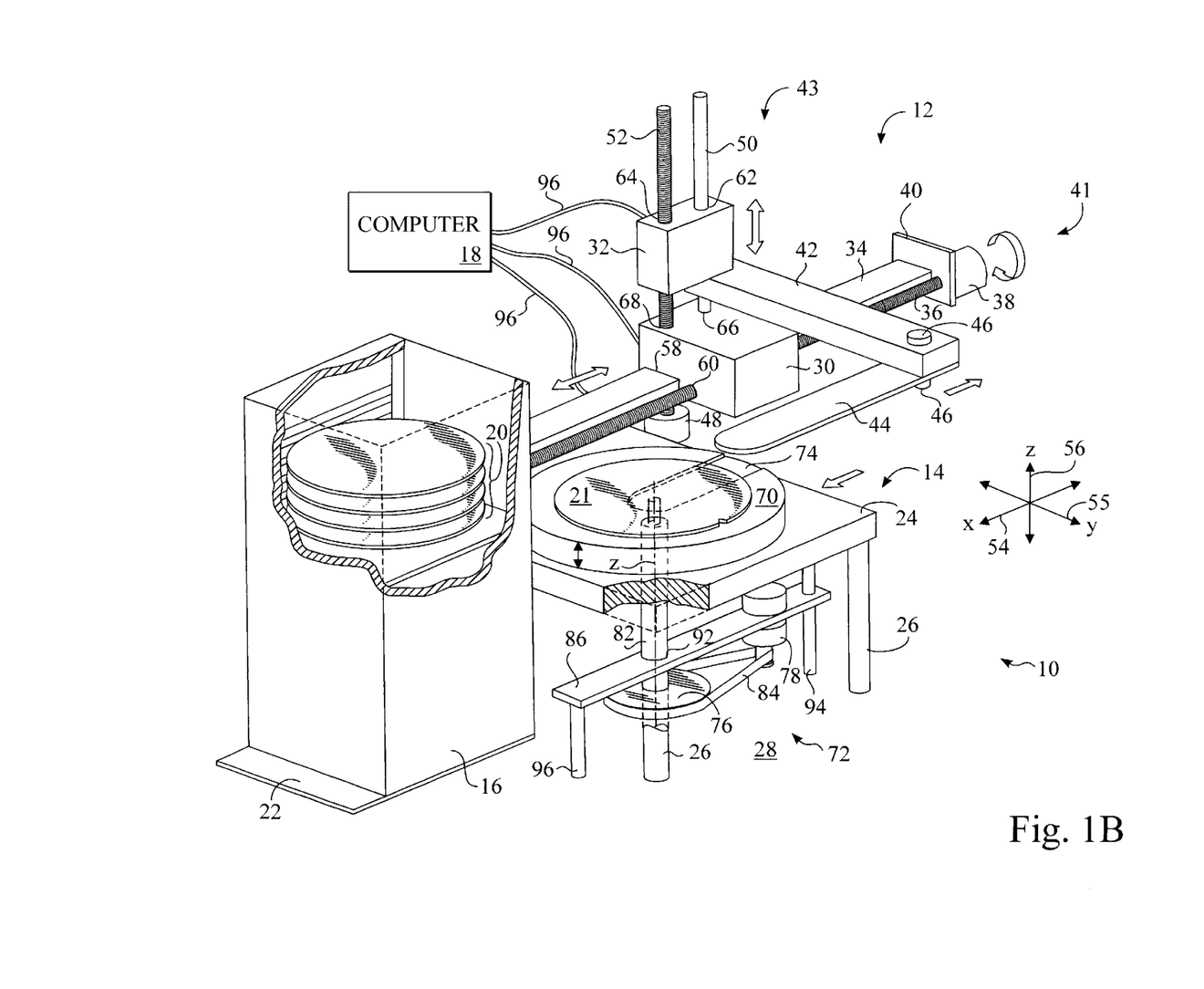
FIG. 1B is an elevational view of the wafer handling and testing apparatus depicting a test chuck that does not move along a z-axis in accordance with one embodiment of the present invention.

FIG. 1B is an elevational view of the wafer handling and testing apparatus 10 depicting a test chuck 70 that does not move along a z-axis in accordance with one embodiment of the present invention. In place of the motor 80 that previously moved the test chuck 70 in FIG. 1A, the support assembly 14 of FIG. 1B includes a leg 96, which is disposed over the reference surface 28 to provide support to the support 86.

Thus, the test chuck 70 is capable of rotating in response to the motor 78 and remains stationary with respect to the z-axis throughout the operation of the apparatus. In this configuration, the wafer handling assembly 12 assumes the function of moving and placing the selected wafer 21 on the chuck 70 by moving along the z-axis 56 as well as the x-axis 54. The apparatus 10 of FIG. 1B thus enables the wafer handling assembly to move along the second axis, a support assembly need not move along the second axis, thereby eliminating the need for a motor.

Figure 1C:
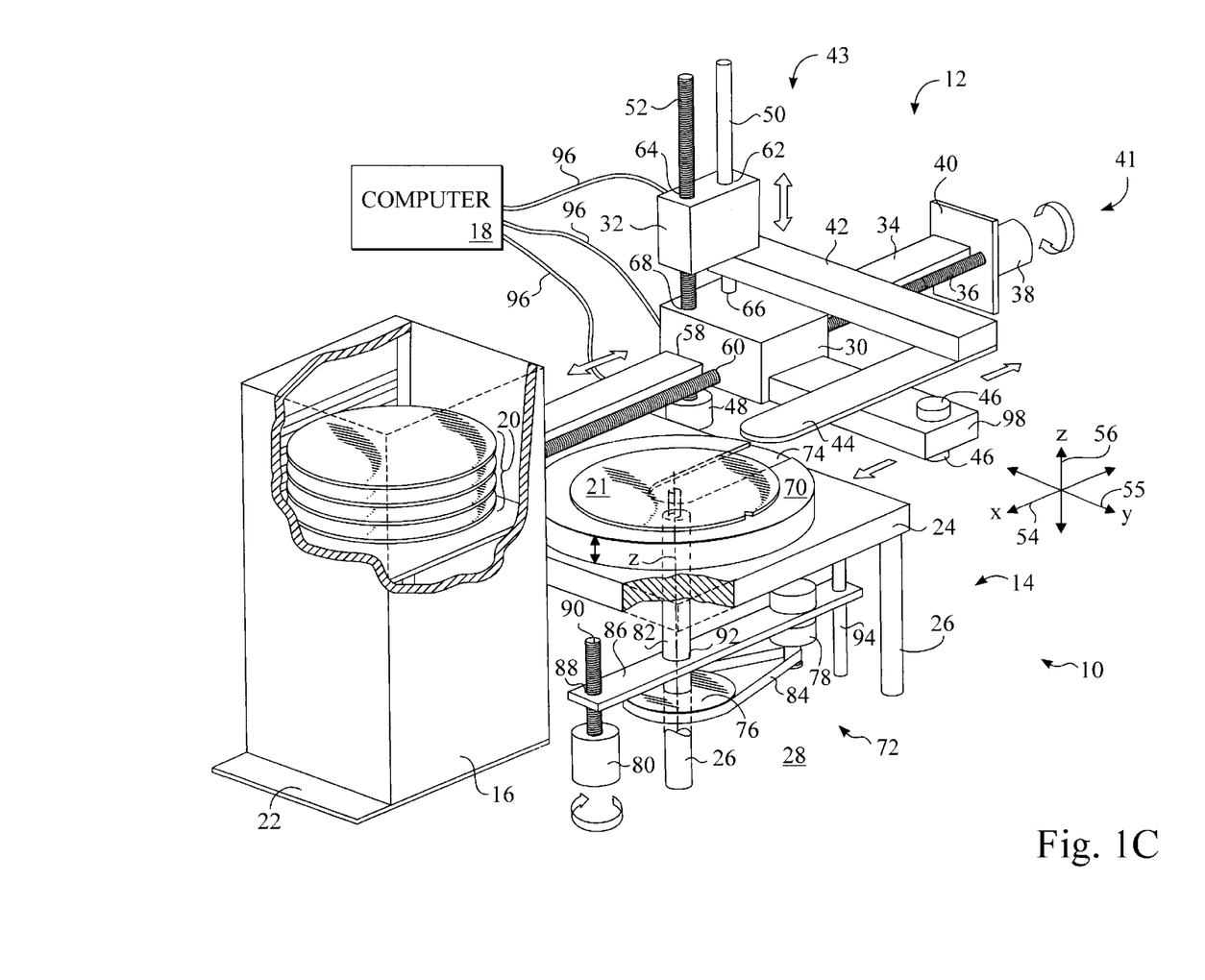
FIG. 1C is an elevational view of the wafer handling and testing apparatus depicting a probe assembly that is constrained to move only in parallel to the x-axis in accordance with one embodiment of the present invention.

FIG. 1C is an elevational view of the wafer handling and testing apparatus 10 depicting a probe assembly 46 that is constrained to move only in parallel to the x-axis 54 in accordance with one embodiment of the present invention. Instead of having the probe assembly 46 on the support arm 42 as previously shown in FIG. 1A, the wafer handling assembly 12 of FIG. 1C includes a support arm 98 attached to the carriage 30.

In this arrangement, the support arm 98 moves in unison with the carriage 30 along the x-axis 54 only. The probe assembly 46 is mounted on the support arm 98 for testing a wafer. Hence, the probe assembly 46 is constrained to move in a direction parallel to the x-axis 54 to be placed over a specified area of the wafer for testing. In this embodiment, the z-motion capability of the chuck 70 is used to compensate for the lack of movement of the probe assembly 46 along the z-axis.

Figure 1D:
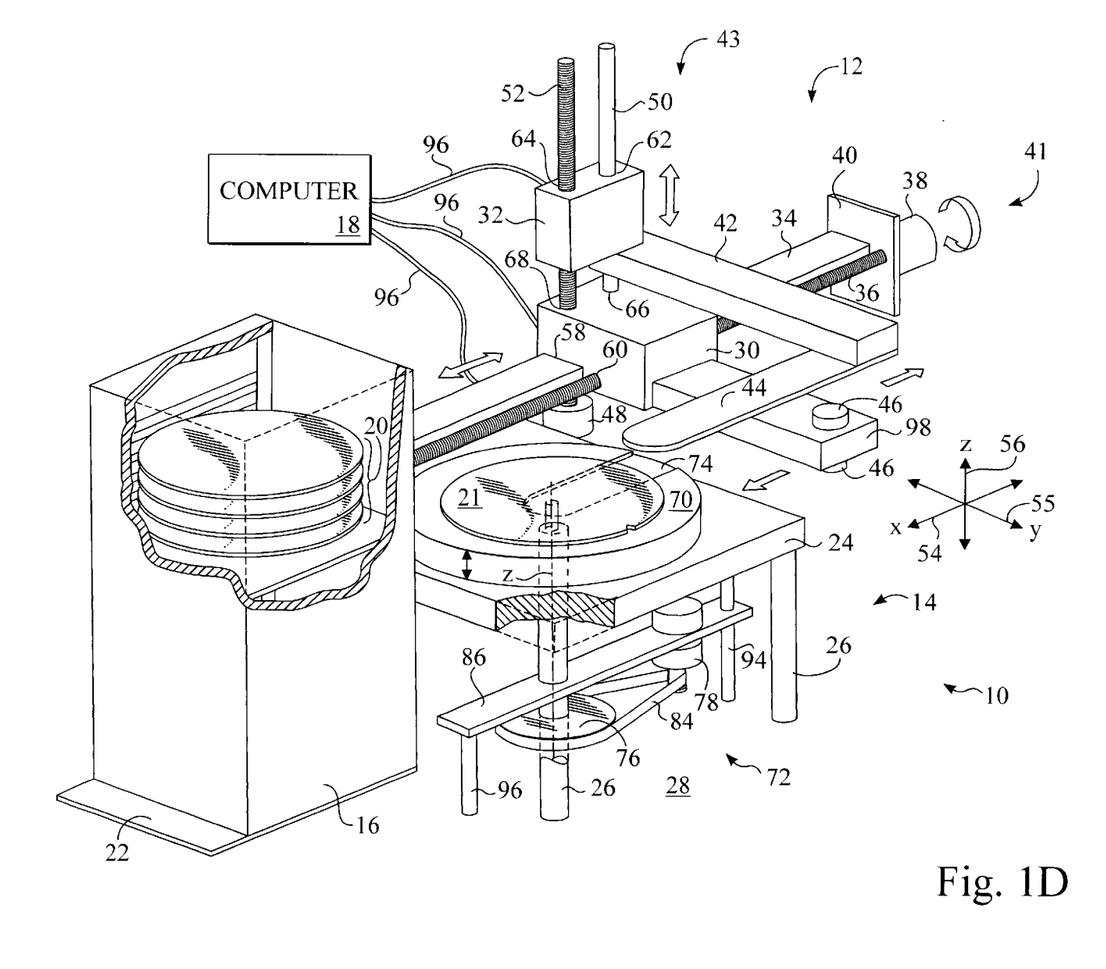
FIG. 1D is an elevational view of the wafer handling and testing apparatus combining the features of the test chuck and the probe assembly of FIGS. 1B and 1C in accordance with one embodiment of the present invention.

FIG. 1D is an elevational view of the wafer handling and testing apparatus 10 combining the features of the test chuck 70 and the probe assembly 46 of FIGS. 1B and 1C in accordance with one embodiment of the present invention. Specifically, the support assembly 14 includes the supporting member 96, which is disposed over the reference surface 28 to provide support to the support 86. In addition, the wafer handling assembly 12 includes the support arm 98 attached to the carriage 30. The probe assembly 46 is mounted on the support arm 98 for testing a wafer.

In this configuration, the wafer blade 44 in the wafer handling assembly 12 performs the function of moving and placing the selected wafer 21 on the test chuck 70 by moving parallel to the z-axis 56 as well as the x-axis 54. The placement of the probe assembly 46 over a specified area of the wafer for testing is performed by moving the carriage 30, the support arm 98, and the probe 46 parallel to the x-axis 54 and by rotating the test chuck 70.

Figure 2A:
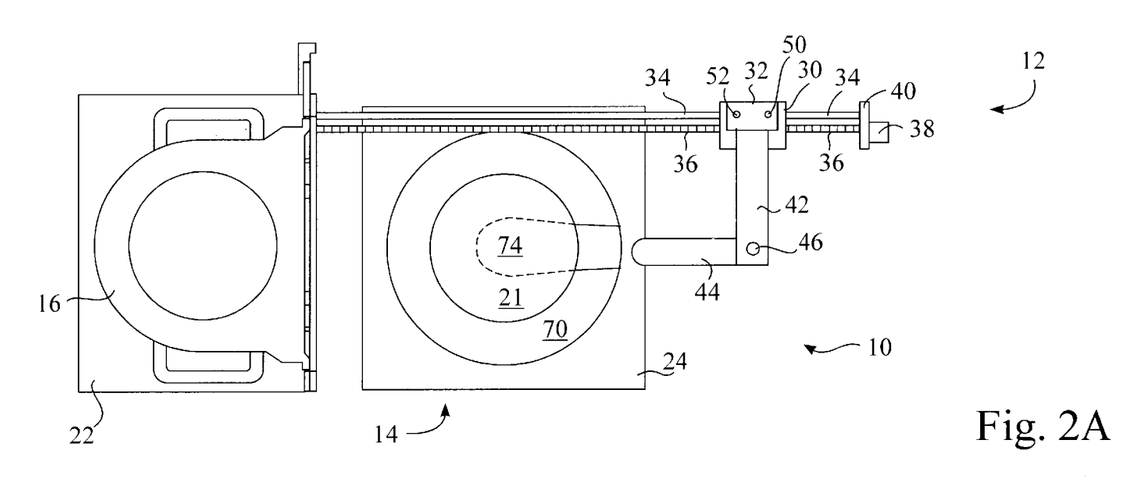
FIG. 2A is a top view of the wafer handling and testing apparatus of FIG. 1A.

FIG. 2A is a top view of the wafer handling and testing apparatus 10 of FIG. 1A. The guide shaft 34 and the lead screw 36 extending through the carriage 30 is coupled to the base plate 22 supporting the wafer carrier 16 in one embodiment. The guide shaft 34 and the lead screw 36 allow the carriage 30 to move in a direction parallel to the x-axis. Preferably, the wafer blade 44 is aligned with the center of the wafers and with the center of the test chuck 70 in a direction parallel to the x-axis.

Figure 2B:
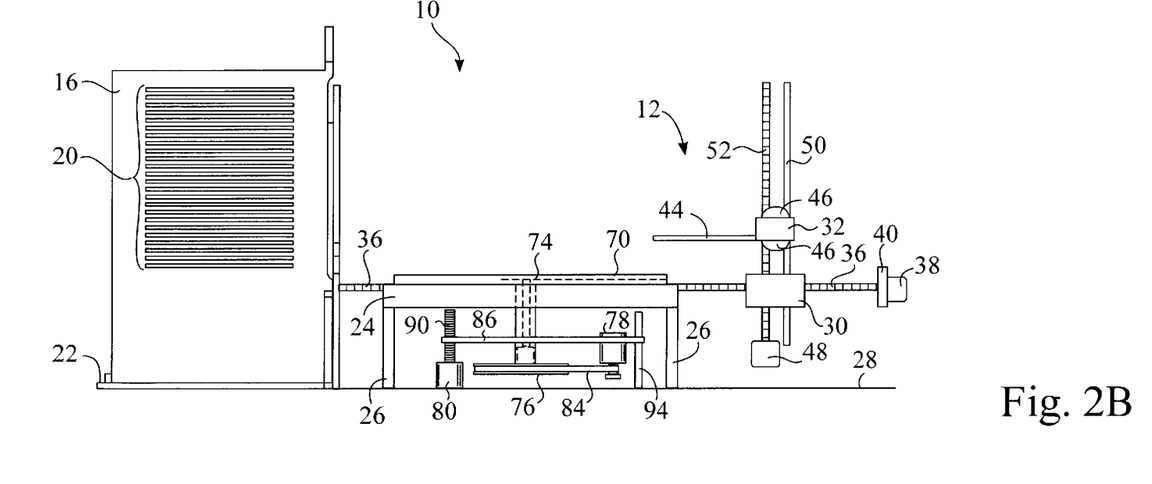
FIG. 2B is a side view of the wafer handling and testing apparatus of FIG. 1A.

FIG. 2B is a side view of the wafer handling and testing apparatus 10 of FIG. 1A. The wafer carrier 16 has been loaded onto the base plate 22 of the wafer handling and testing apparatus 10 for testing the wafers 20. The wafer handling assembly 12 is initially away from the wafer carriage 16. When a wafer is to be tested, the wafer handling assembly 12 moves in the direction of the x-axis and the z-axis toward the selected wafer in the wafer carrier 16.

Figure 3A:
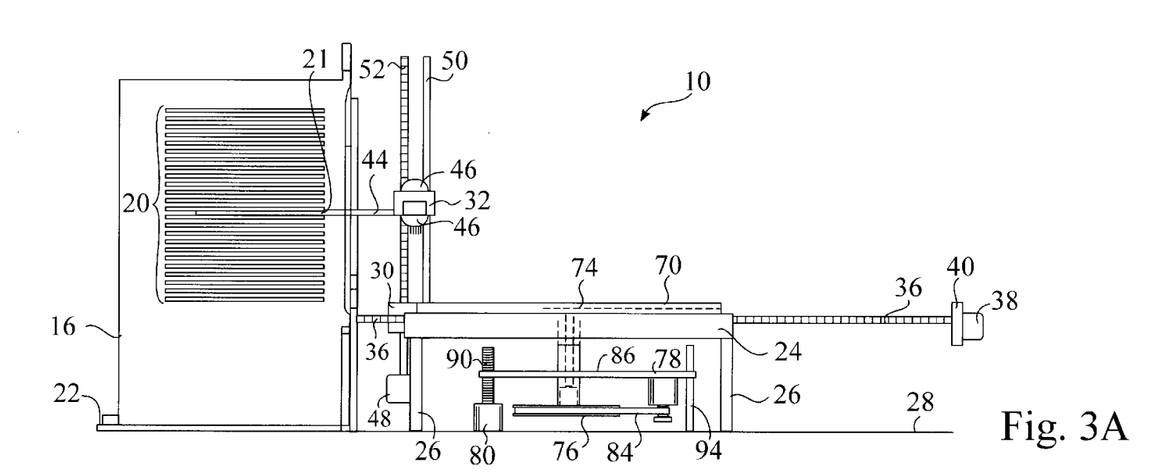
FIG. 3A illustrates a side view of the apparatus of FIG. 1A after the wafer blade has been positioned to pick up the selected wafer.

FIG. 3A shows a side view of the apparatus 10 of FIG. 1A after the wafer blade 44 has been positioned to pick up the selected wafer 20. To arrive at this position, the wafer blade 44 along with the other elements of the wafer handling assembly 12 (e.g., carriages 30 and 32, support arm 42) has moved in both the x-axis and the z-axis. The wafer blade 44 is inserted into the wafer carrier 16 just underneath the wafer 21, which is supported by a guide slot in the carrier.

In some embodiments in which the wafer carrier 16 is an enclosed pod that seals the wafers from contaminants, the wafer blade 44 may be inserted through a small opening in an interface panel, as is described in co-pending U.S. patent application Ser. No. 08/920,210, filed Aug. 25, 1997, by David Cheng. In many pods and other wafer carriers, the bottommost wafer in the wafer carrier 16 is typically the wafer that is first tested and/or processed, followed by each wafer positioned in the next higher slot of the carriers. After positioning the wafer blade 44 under the selected wafer 21, the wafer blade 44 picks up the selected wafer 21 for moving the selected wafer 21 to the support assembly 14 for testing.

Figure 3B:
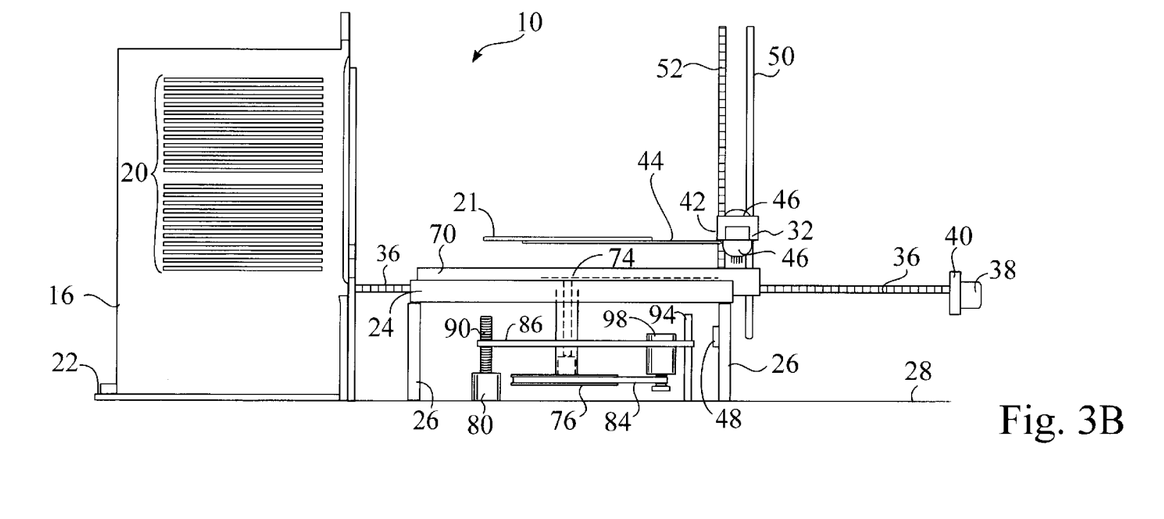
FIG. 3B illustrates a side view of the wafer handling and testing apparatus depicting the positioning of the selected wafer over the chuck.

FIG. 3B illustrates a side view of the wafer handling and testing apparatus 10 depicting the positioning of the selected wafer over the chuck. The motors 38 and 48 control the rotation of the screws 36 and 52, respectively, to move the wafer handling assembly 12 until the selected wafer 21 is centered over the test chuck 70. The selected wafer 21 may then be placed on the test chuck 70. In one embodiment, the motor 80 causes the test chuck 70 to move up to receive the selected wafer 21. In another embodiment, the motor 48 may cause the carriage 32 to move down to place the selected wafer 21 on the test chuck 70.

Figure 3C:
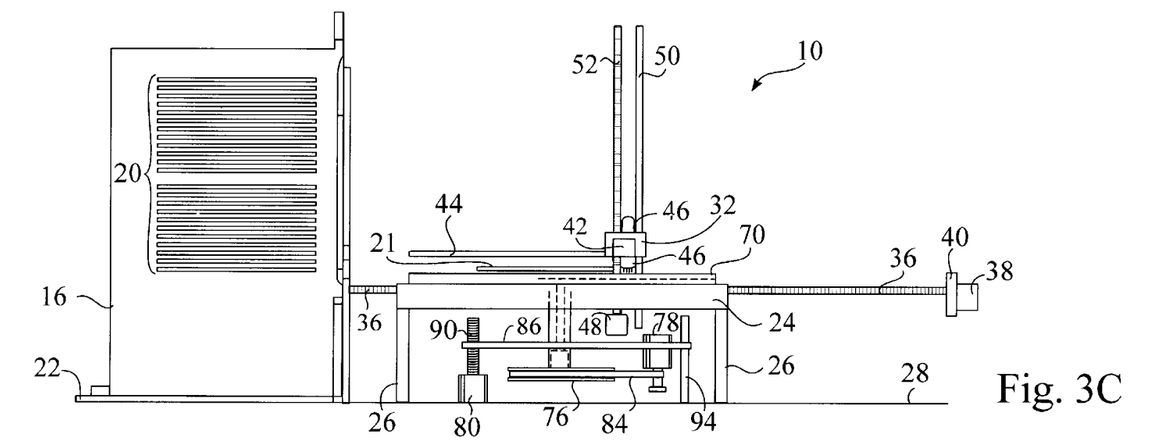
FIG. 3C illustrates a side view of the wafer handling and testing apparatus testing the selected wafer.

FIG. 3C shows a side view of the wafer handling and testing apparatus 10 testing the selected wafer 21. The motors 38 and 48 moves the carriage 32 in the x-axis or the z-axis directions to place the carriage 32 in a position to allow the probe assembly 46 to test a specified area of the selected wafer 21. Preferably, the motors 38 and 48 move the carriage 32 such that the probe assembly 46 on the support arm 42 is positioned directly over the test area of the selected wafer 21. In addition, the motor 78 may further rotate the test chuck 70 to place the test area of the selected wafer 21 under the probe 46 assembly. In one embodiment, the motor 80 may be used to move the test chuck 70 to place the specified test area of the selected wafer 21 under the probe assembly 46.

After placing the specified test area of the selected wafer 21 under or in contact with the probe assembly 46, the probe assembly 46 performs one more tests to determine the characteristics of the wafer. The probe assembly 46 may be implemented as a test head that contacts the surface of the selected wafer 21 to be tested. For example, the test head may include individual probe leads, which are designed to take test measurements on the surface of the selected wafer 21.

In one embodiment, the test head includes a four-point probe apparatus that includes four metal, spring-loaded probes that engage the surface of the selected wafer 21. A current is typically induced in the outer probes of the four-point probe and the voltage across the inner probes is measured. Such a probe is designed to measure wafer resistivity and film thickness. Four-point probes are well known in the art. Those skilled in the art will readily appreciate that the present invention may utilize other test probes to test various other characteristics of a wafer.

Figure 3D:
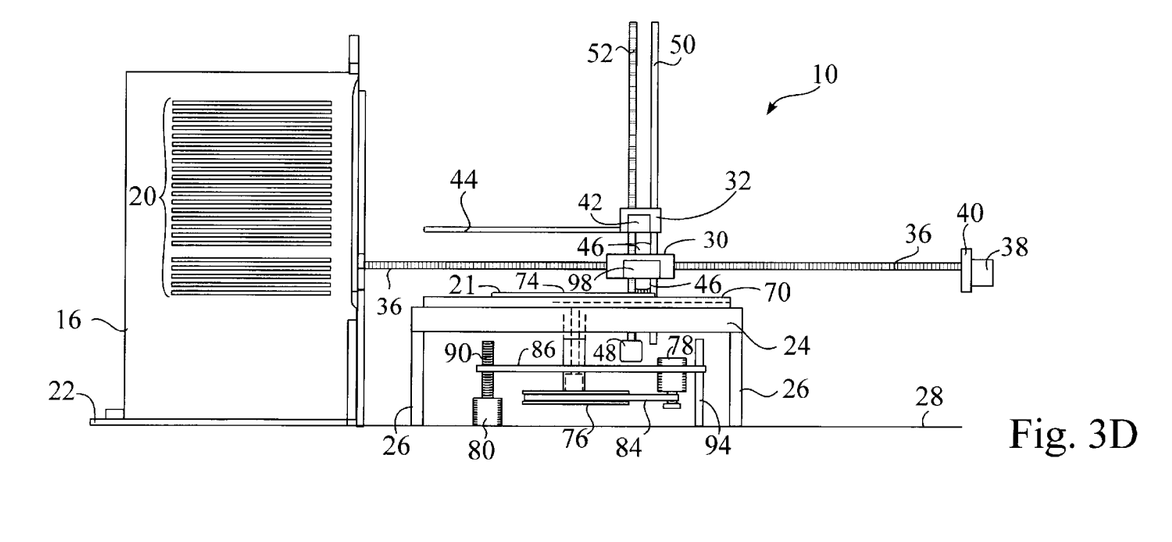
FIG. 3D illustrates a side view of the wafer handling and testing apparatus of FIG. 1C performing a test on the selected wafer.

FIG. 3D illustrates a side view of the wafer handling and testing apparatus 10 of FIG. 1C performing a test on the selected wafer. As illustrated above, the probe assembly 46 is mounted on the support arm 98, which is in turn attached to the carriage 30. After placing the selected wafer 21 on the test chuck 70, the wafer blade 44 moves away (e.g. up) to enable the support arm 98 having the probe assembly 46 to maneuver into position for testing.

In this configuration, because the carriage 30 is constrained to movement along the x-axis, the probe assembly 46 is also constrained to move in parallel to the x-axis. The motor 38 moves the probe assembly 46 into a desired testing position along the x-axis over the wafer. Preferably, the motor 78 also rotates the selected wafer 21 to place a specified area of the selected wafer 21 to be tested under the probe assembly 46. In addition, the motor 80, when provided, may move along the z-axis to position the selected wafer 21 under the probe assembly 46 for testing.

After the tests have been completed, the wafer blade 44 is used to pick up the selected wafer 21 from the test chuck 70 and return the selected wafer 21 to the wafer carrier 16. The wafer blade 44 is moved under the selected wafer 21 into the blade insert 74 by using the first and second carriage assemblies 41 and 43, as described above. The wafer blade 44 is then able to pick up the selected wafer 21 and transport it back to the wafer carrier 16, after which the wafer blade 44 may select and remove a different wafer 20 for testing in the same manner.

Figure 4:
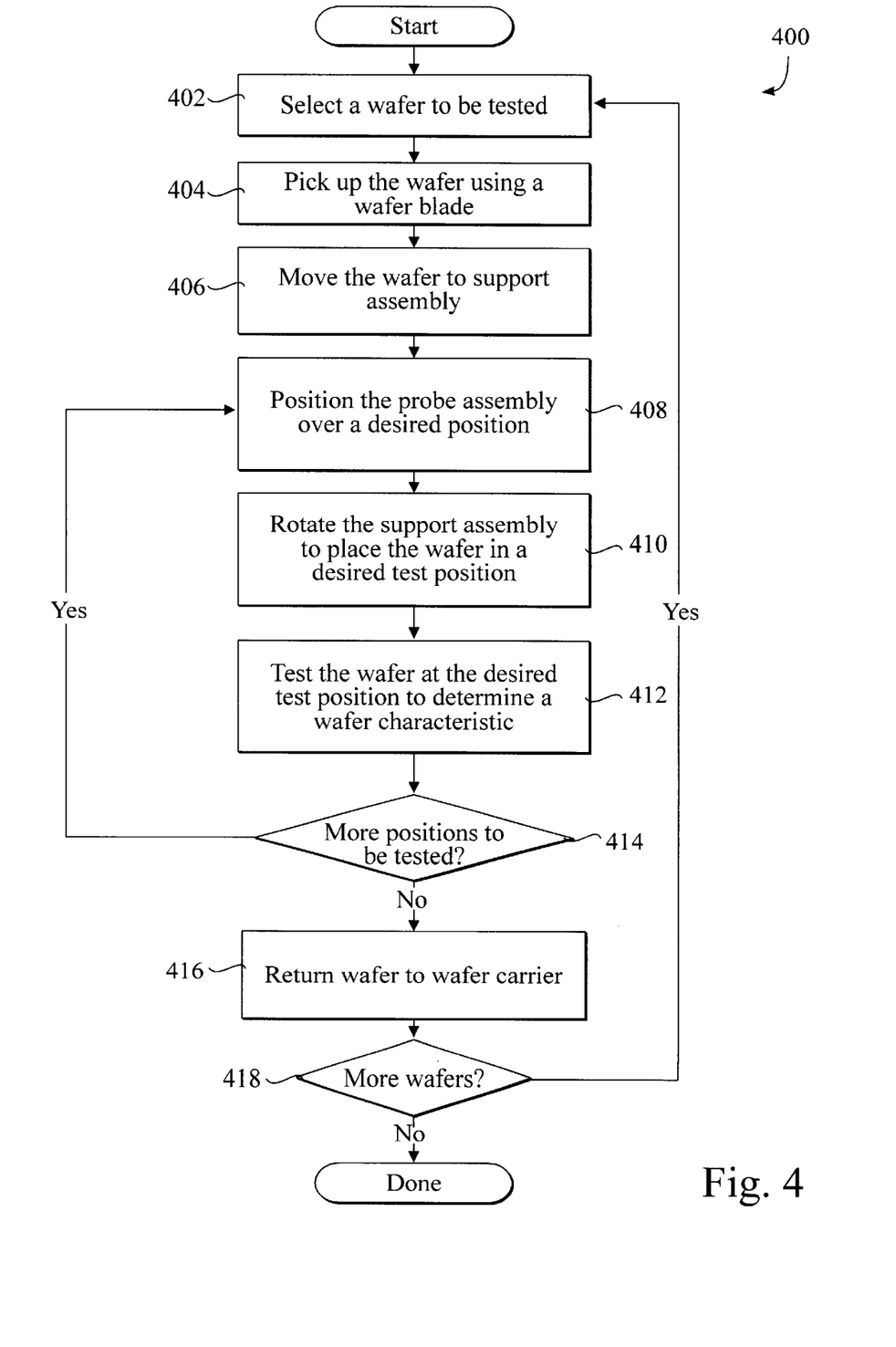
FIG. 4 shows a flow diagram illustrating a method for handling and testing a wafer in accordance with one embodiment of the present invention.

FIG. 4 shows a flow diagram illustrating a method 400 for handling and testing a wafer in accordance with one embodiment of the present invention. The acts of method 400, in the preferred embodiment, are controlled by computer 18 using the motors of the wafer handling and testing apparatus, where the computer can follow program instructions or code to control the wafer handling and testing apparatus. Alternatively, some acts can be performed by manual or operator control.

The method 400 begins at an act 402 where a wafer to be tested is selected from a wafer carrier. In act 404, the selected wafer is picked up with a wafer blade (e.g., end effector, wafer pick, etc.). Preferably, the wafer blade is moved into the wafer carrier underneath the selected wafer and moved upwards to pick up the wafer. When the selected wafer is lifted off of the walls of a slot in which the selected wafer is positioned in the wafer carrier, the selected wafer is supported only by the wafer blade.

In an act 406, the wafer blade moves the selected wafer to a support assembly. In one embodiment of the present invention, the wafer blade has two degrees of freedom so that it is capable of moving the selected wafer along paths parallel to both the x-axis and the z-axis. The placement of the selected wafer on the support assembly may be accomplished by either moving the wafer blade down to the support assembly or by moving the support assembly up to the wafer blade to receive the wafer.

In an act 408, the probe assembly is positioned over a desired position (r,θ) by using a first carriage assembly and a second carriage assembly to move a support arm, which supports the probe assembly. Then, in an act 410, the support assembly is rotated to place the wafer at a desired test position (θ) so that a specified area of the wafer is placed under the probe assembly. Act 410 may also involve centering and orienting the wafer, for example, by rotating the support assembly and the wafer so that the center of the wafer is aligned with the center of the support assembly.

In an act 412, the test probe then tests the wafer at the specified test area to determine one or more wafer characteristics such as resistivity and wafer thickness. In one embodiment of the present invention, more than one area of the wafer may be tested. For example, the support assembly and the probe assembly may be rotated or moved to place another area of the wafer under the probe for testing. An act 414 then determines whether more positions on the wafer are to be tested. If more positions need to be tested, then method 400 returns to act 408.

After the testing is conducted, the wafer blade picks up the wafer and places the wafer back in the wafer carrier, in an act 416. The wafer is placed, preferably in the original slot from which the wafer was removed. The method 400 then proceeds to act 418 to determine if more wafers need to be tested. If so, the method 400 proceeds back to act 402 to select another wafer for testing, otherwise, the method 400 is terminated.

In summary, the present invention provides a wafer handling and testing apparatus that efficiently moves and tests wafers without moving the wafer carrier or cassette by providing a wafer handling assembly that is able to move a selected wafer with two degrees of freedom. The invention has been described in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A wafer handling and testing apparatus comprising:
   a support assembly capable of supporting a wafer to be tested, the support assembly also being capable of rotating the wafer for testing;
   a wafer handling assembly arranged to move the wafer to and from the support assembly, the wafer handling assembly capable of moving the wafer only along a first axis and a second axis, the first axis being substantially orthogonal to the second axis, wherein no more than one motor is used for each of said axes; and
   a probe assembly arrange to test the wafer when the wafer is placed on the support assembly.

2. The apparatus as recited in claim 1, wherein the first axis is an x-axis.

3. The apparatus as recited in claim 1, wherein the second axis is a z-axis.

4. The apparatus as recited in claim 1, wherein the first axis is in a horizontal plane.

5. The apparatus as recited in claim 1, wherein the second axis is in a vertical plane.

6. The apparatus as recited in claim 1, wherein the support assembly is capable of rotating the wafer in a x-y plane.

7. The apparatus as recited in claim 1, wherein the support assembly is capable of rotating the wafer in a horizontal plane.

8. The apparatus as recited in claim 1, further comprising:
   a wafer carrier adapted to hold a plurality of wafers to be tested for providing the wafer handling assembly with access to the wafers.

9. The apparatus as recited in claim 8, wherein the wafer carrier is an enclosed wafer pod.

10. The apparatus as recited in claim 8, wherein the wafer carrier is an open wafer cassette.

11. The apparatus as recited in claim 1, wherein the support assembly further comprises:
    a chuck including a platform, the platform being arranged to support the wafer to be tested, the chuck being arranged to rotate the platform and the wafer to a specified angular position for testing the wafer.

12. The apparatus as recited in claim 1, wherein the support assembly is capable of moving the wafer along the second axis.

13. The apparatus as recited in claim 1, wherein the support assembly further comprises:
    a chuck including a platform for supporting the wafer to be tested on the platform, the chuck being arranged to rotate the wafer to a specified angular position for testing; and
    a mechanism arranged to move the platform along the second axis.

14. The apparatus as recited in claim 1, wherein the wafer handling assembly further comprises:
    a carriage assembly arranged to move along the first axis and the second axis;
    a support arm attached to the carriage assembly to move in response to the movement of the carriage assembly; and
    a wafer blade attached to the support arm and being adapted to pick up the wafer to be tested such that the movement of the carriage assembly moves the wafer blade and the wafer to and from the support assembly.

15. The apparatus as recited in claim 14, wherein the carriage assembly further comprises:
    a second carriage assembly arranged to move the wafer blade along the second axis; and
    a first carriage assembly arranged to move the second carriage assembly along the first axis.

16. The apparatus as recited in claim 15, wherein the probe assembly is attached to the first carriage assembly such that the probe assembly is capable of moving along the first axis.

17. The apparatus as recited in claim 15, wherein the wafer blade is attached to the second carriage assembly such that the wafer blade is capable of moving along the first axis and the second axis.

18. The apparatus as recited in claim 17, wherein the probe assembly is attached to the wafer blade such that the probe assembly is capable of moving along the first axis and the second axis.

19. The apparatus as recited in claim 14, wherein the wafer blade is a vacuum pick.

20. The apparatus as recited in claim 1, wherein the probe assembly is mounted on the wafer handling assembly such that the probe assembly is also capable of moving along the first axis and the second axis.

21. The apparatus as recited in claim 1, wherein said probe assembly includes a test probe head.

22. The apparatus as recited in claim 21, wherein the wafer blade is an end effector.

23. The apparatus as recited in claim 1, further comprising a computer system configured to control the wafer handling assembly and the support assembly for testing the wafer.

24. An integrated wafer handling and testing apparatus comprising:
    supporting means for supporting a wafer to be tested, the wafer supporting means being capable of rotating the wafer in a x-y plane for testing;
    handling means for moving the wafer to and from the wafer support assembly, the handling means capable of moving the wafer only along a first axis and a second axis, the first axis being orthogonal to the second axis, wherein no more than one motor is used for each of said axes; and
    testing means for testing the wafer when the wafer is placed on the support means.

25. The apparatus as recited in claim 24, wherein the second axis is a vertical axis.

26. The apparatus as recited in claim 24, wherein the supporting means is capable of rotating the wafer in a x-y plane.

27. The apparatus as recited in claim 24, further comprising:
    a wafer carrying means for holding a plurality of wafers to be tested, wherein the handling means moves the wafers between the wafer carrying means and the supporting means.

28. The apparatus as recited in claim 24, wherein the supporting means further comprises:
    a chuck arranged to support the wafer to be tested, the chuck also being arranged to rotate the wafer to a specified angular position for testing; and
    a mechanism arranged to move the chuck in along a z-axis.

29. The apparatus as recited in claim 24, wherein the first axis is an x-axis and the second axis is a z-axis.

30. The apparatus as recited in claim 29, wherein the handling means further comprises:
    a carriage assembly arranged to move along the x-axis and the z-axis;
    a support arm attached to the carriage assembly and being arranged to move in response to the movement of the carriage assembly; and a wafer blade attached to the support arm and being adapted to pick up the wafer to be tested such that the movement of the carriage assembly moves the wafer blade and the wafer to and from the support assembly.

31. The apparatus as recited in claim 30, wherein the carriage assembly further comprises:

a second carriage assembly arranged to move the wafer blade along the z-axis; and a first carriage assembly arranged to move the second carriage assembly in the x-axis.

32. The apparatus as recited in claim 24, further comprising a control circuit configured to control the wafer handling assembly and the support assembly for testing the wafer.

33. A method for handling a wafer from a stationary wafer carrier for testing, the stationary wafer including a plurality of wafers to be tested, the method comprising:

selecting a wafer to be tested;

picking up the wafer;

moving the wafer only along an x-axis and a z-axis to a support assembly for testing, wherein no more than one motor is used for each of the axes;

placing the wafer on the support assembly;

rotating the support assembly to place the wafer at a desired test position; and testing the wafer at the desired test position to determine a wafer characteristic.

34. The method as recited in claim 33, wherein the wafer is picked up from a wafer carrier.

35. The method as recited in claim 34, further comprising returning the tested wafer to the wafer carrier.

36. The method as recited in claim 35, wherein the wafer returning further comprises:

picking up the tested wafer;

moving the tested wafer along an x-axis and a z-axis to the wafer carrier; and placing the tested wafer in the wafer carrier.

37. The method as recited in claim 33, wherein the wafer moving further comprises:

moving the wafer along the x-axis over the support assembly; and moving the wafer along the z-axis down to the support assembly.

38. The method as recited in claim 33, wherein the wafer moving comprises:

moving the wafer along the z-axis; and moving the wafer along the x-axis over the support assembly.

39. The method as recited in claim 33, wherein the wafer is moved in both the x-axis and the z-axis simultaneously.

40. The method as recited in claim 33, wherein the support assembly moves along the z-axis.

41. The method as recited in claim 33, wherein the support assembly moves along the z-axis to receive the wafer.

42. The method as recited in claim 33, wherein the support assembly moves along the z-axis for testing the wafer.

43. The method as recited in claim 42, wherein the wafer testing further comprises:

moving a probe assembly along the x-axis over to a desired x-axis test position;

moving the support assembly under the probe assembly to a desired z-axis test position, wherein the x-axis test position and z-axis test position define the desired test position; and testing the wafer at the desired test position by the probe assembly.

44. The method as recited in claim 33, wherein the wafer testing further comprises:

moving a probe assembly along the x-axis and the z-axis over to the desired test position; and testing the wafer at the desired test position by the probe assembly.

45. The method as recited in claim 33, wherein the wafer testing further comprises:

moving a probe assembly along the x-axis over to the desired test position; and testing the wafer at the desired test position by the probe assembly.

* * * * *